US010438954B2

(12) United States Patent
Kusumoto et al.

(10) Patent No.: US 10,438,954 B2
(45) Date of Patent: Oct. 8, 2019

(54) METHOD OF FORMING SEMICONDUCTOR DEVICE INCLUDING TUNGSTEN LAYER

(71) Applicant: Micron Technology, Inc., Boise, ID (US)

(72) Inventors: Kenichi Kusumoto, Higashihiroshima (JP); Yasutaka Iuchi, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/134,771

(22) Filed: Sep. 18, 2018

(65) Prior Publication Data
US 2019/0035793 A1    Jan. 31, 2019

Related U.S. Application Data

(62) Division of application No. 15/593,131, filed on May 11, 2017, now Pat. No. 10,109,635.

(30) Foreign Application Priority Data

Sep. 21, 2016  (JP) .................................. 2016-183990

(51) Int. Cl.
| H01L 21/00 | (2006.01) |
| H01L 27/108 | (2006.01) |
| H01L 21/02 | (2006.01) |
| H01L 21/67 | (2006.01) |
| H01L 21/768 | (2006.01) |
| H01L 23/532 | (2006.01) |

(52) U.S. Cl.
CPC .... *H01L 27/10885* (2013.01); *H01L 21/0214* (2013.01); *H01L 21/0217* (2013.01); *H01L 21/0223* (2013.01); *H01L 21/02266* (2013.01); *H01L 21/02332* (2013.01); *H01L 21/67138* (2013.01); *H01L 21/67167* (2013.01); *H01L 21/67207* (2013.01); *H01L 21/76826* (2013.01); *H01L 21/76828* (2013.01); *H01L 21/76834* (2013.01); *H01L 23/53266* (2013.01); *H01L 27/10814* (2013.01); *H01L 27/10817* (2013.01); *H01L 27/10823* (2013.01)

(58) Field of Classification Search
CPC ......... H01L 27/10885; H01L 27/10823; H01L 21/02332
See application file for complete search history.

(56) References Cited

U.S. PATENT DOCUMENTS

| 5,906,866 | A  * | 5/1999 | Webb ........................ C23C 8/02 204/192.32 |
| 6,271,121 | B1 * | 8/2001 | Webb ........................ C23C 8/02 257/E21.584 |
| 6,607,985 | B1 * | 8/2003 | Kraft .................. H01L 21/31116 257/E21.252 |
| 7,160,577 | B2 * | 1/2007 | Ahn .................... C23C 16/4412 427/255.31 |

(Continued)

*Primary Examiner* — Laura M Menz
(74) *Attorney, Agent, or Firm* — Wells St. John P.S.

(57) ABSTRACT

A method of forming a semiconductor device includes forming a tungsten layer over a semiconductor substrate in a first chamber, transferring the substrate over which the tungsten layer is formed from the first chamber to a second chamber without exposing into an atmosphere including oxygen, and forming a silicon nitride layer on the tungsten layer in the second chamber.

9 Claims, 9 Drawing Sheets

(56) References Cited

U.S. PATENT DOCUMENTS

| | | | | |
|---|---|---|---|---|
| 7,826,033 B2* | 11/2010 | Yang | ............................ | G03F 1/50 |
| | | | | 355/53 |
| 9,373,628 B2* | 6/2016 | Sohn | .................. | H01L 27/11556 |
| 10,109,635 B2* | 10/2018 | Kusumoto | ........ | H01L 27/10823 |
| 2002/0009861 A1* | 1/2002 | Narwankar | .............. | C23C 16/56 |
| | | | | 438/404 |
| 2002/0180044 A1* | 12/2002 | Lu | ......................... | H01L 21/2855 |
| | | | | 257/751 |
| 2004/0038530 A1* | 2/2004 | Shin | ................... | H01L 21/28247 |
| | | | | 438/685 |
| 2005/0170266 A1* | 8/2005 | Yang | ........................... | G03F 1/50 |
| | | | | 430/5 |
| 2008/0048274 A1* | 2/2008 | Seo | ................... | H01L 21/28061 |
| | | | | 257/411 |
| 2012/0058252 A1* | 3/2012 | Sweeney | ................. | C23C 14/48 |
| | | | | 427/58 |
| 2013/0017689 A1* | 1/2013 | Khan | ................... | H01L 21/0214 |
| | | | | 438/770 |
| 2017/0148670 A1* | 5/2017 | Lei | ........................ | C23C 16/4401 |
| 2018/0083010 A1* | 3/2018 | Kusumoto | ........ | H01L 27/10823 |
| 2019/0035793 A1* | 1/2019 | Kusumoto | ........ | H01L 27/10823 |

\* cited by examiner

METHOD OF FORMING SEMICONDUCTOR DEVICE INCLUDING TUNGSTEN LAYER

RELATED PATENT DATA

This patent resulted from a divisional of U.S. patent application Ser. No. 15/593,131, which was filed May 11, 2017, and which is hereby incorporated herein by reference; which is based upon and claims the benefit of priority from Japanese Patent Application No. 2016-183990 filed on Sep. 21, 2016, the disclosure of which is incorporated herein in its entirety by reference.

FIELD OF INVENTION

The present invention relates to a semiconductor device and a manufacturing method thereof, and more particularly concerns such a semiconductor device provided with tungsten wiring and a manufacturing method thereof.

DESCRIPTION OF PRIOR ART

In a semiconductor memory device such as a DRAM (Dynamic Random Access Memory), bit lines are sometimes made of tungsten.

However, since a whisker tends to be generated from the tungsten wiring during a manufacturing process, it is necessary to prevent this. As a method for preventing a whisker in the tungsten wiring, such a method has been known in which the surface of a tungsten wiring is coated with a silicon nitride film as disclosed by Japanese Patent Application Laid-Open No. 2002-093743.

However, in the method disclosed by the Patent Document, during a period until a silicon nitride film has been formed after the formation of a tungsten layer, the surface of the tungsten layer is undesirably oxidized to cause a problem in that the resistance value of the tungsten wiring becomes higher. Moreover, upon forming the silicon nitride film, the surface of the tungsten layer is nitrided in some cases, the resistance value of the tungsten wiring also becomes higher in these cases.

DETAILED DESCRIPTION OF THE EMBODIMENTS

Referring to attached drawings, the following description will discuss embodiments of the present invention.

Figure 1:
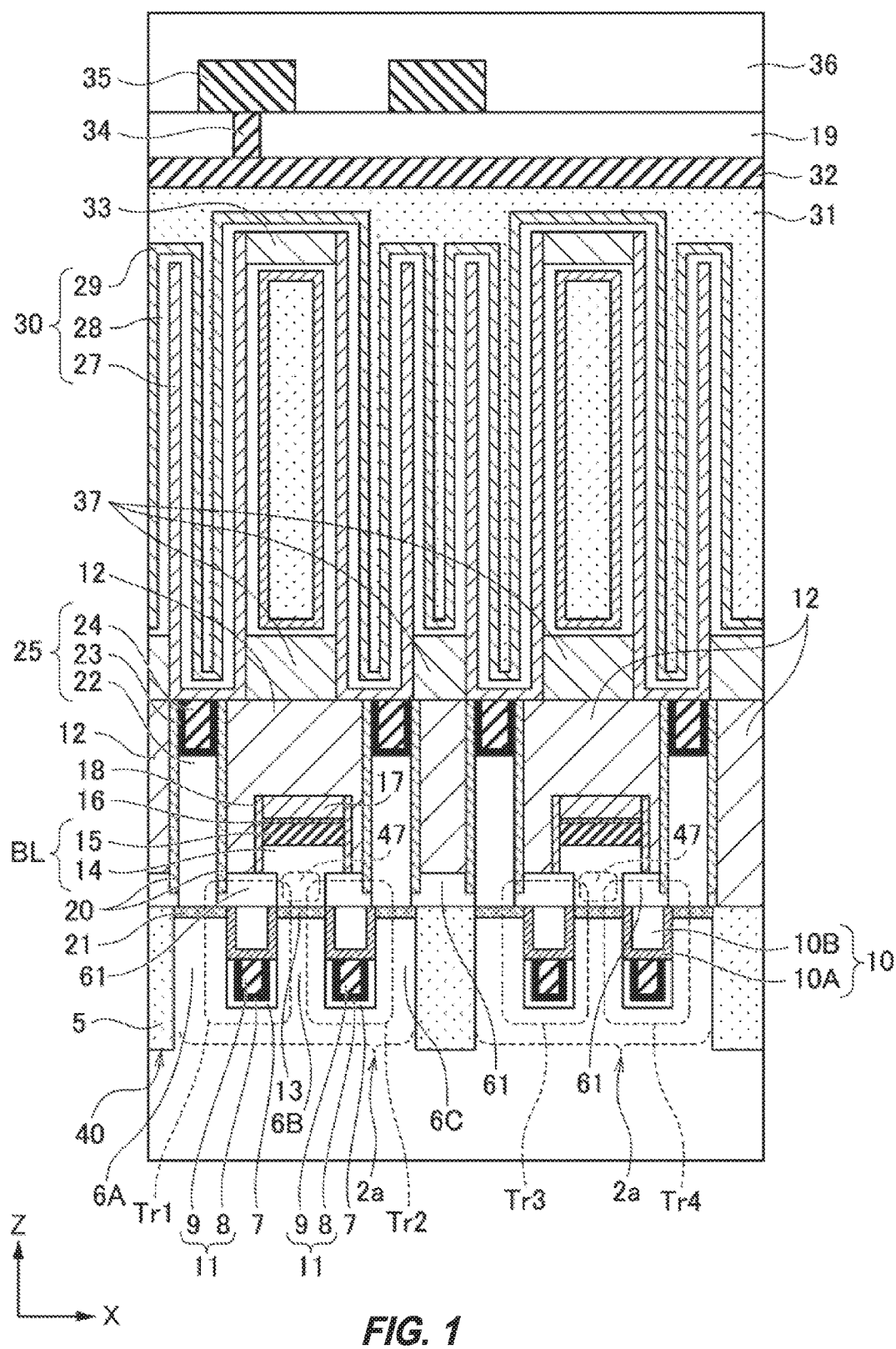
FIG. 1 is a cross-sectional view showing a configuration of a semiconductor device in accordance with one embodiment of the present invention.

FIG. 1 is a cross-sectional view showing a configuration of a semiconductor device in accordance with one embodiment of the present invention.

The semiconductor device in accordance with the present invention is a DRAM, and on a cross-section shown in FIG. 1, four embedded MOS transistors Tr1 to Tr4 are shown. Since the configuration of each of the embedded MOS transistors Tr1 to Tr4 is mutually the same, the following description will discuss the configuration of the embedded MOS transistor Tr1.

The embedded MOS transistor Tr1 is provided in an active region 2a of a silicon substrate 1 surrounded by element separation regions 5. Additionally, each of the element separation regions 5 may be formed by burying an element separation groove formed on the silicon substrate 1 with an insulating film. The embedded MOS transistor Tr1 is provided with an embedded word line 11, and impurity diffusion layers 13 and 21 serving as source/drain regions. The embedded word line 11 is provided on a gate insulating film 7 that covers the inner wall of a word groove formed on the active region 2a. The embedded word line includes an interposed layer 8 that covers the surface of the gate insulating film 7, and a conductor film 9 for burying the word groove with the gate insulating film 7 and the interposed layer 8 interpolated therebetween. The conductor film 9 is covered with the embedded insulating film 10 on its upper surface. In this case, the embedded insulating film 10 may include a lower embedded insulating film 10A that covers the inner surface of a concave portion located on the upper surface of the conductor film 9 and an upper embedded insulating film 10B that covers the lower embedded insulating film 10A and buries the word groove. The lower embedded insulating film 10A may include a silicon nitride film, and the upper embedded insulating film 10B may include a silicon oxide film. On the upper surface of the embedded insulating film 10, a mask film 61 may be stacked. The mask film 61 is also formed on the upper surface of the element separation region 5.

On an upper side of the embedded MOS transistor Tr1, a bit line BL and a capacitor 30 are provided. The capacitor 30, which may be a crown-type capacitor, includes a lower electrode 27, a capacitive insulating film 28 and an upper electrode 29. Additionally, the lower electrode 27 has a crown shape provided with an inner wall and an outer wall, and the inner wall and the outer wall are successively covered with the capacitive insulating film 28 and the upper electrode 29. Moreover, the surface of the upper electrode 29 having concave/convex portions is buried with an embedded film 31 made of a conductor, and on the upper surface of the embedded film 31, a plate electrode 32 is disposed. Side faces of the adjacent lower electrodes 27 may be mutually supported by support films 33 for use in preventing the lower electrodes 27 from being collapsed.

Onto the upper surface of the impurity diffusion layer 13 disposed on an upper portion of a second active region 6B, a bit contact plug 47 is connected. The bit contact plug 47 may be formed together with the conductor film 14 forming the bit line BL extending in an X-direction as an integral unit. In this case, the bit line BL has a structure in which the conductor film 14 and a tungsten layer 15 are stacked together. The upper surface of the bit line BL may be covered with a silicon oxynitride film 16 and a silicon nitride film 17, and its side face portions may be covered with a side wall insulating film 18. Onto the upper surface of an impurity diffusion layer 21 disposed on upper portions of the first active region 6A and the third active region 6C constituting the embedded MOS transistors Tr1 and Tr2, a lower electrode 27 is connected with a capacitive contact plug 25 interposed therebetween.

The capacitive contact plug 25 has a laminated structure in which an interposed layer 23 is provided between a conductor film 22 and a conductor film 24, and its side face portions are covered with a side wall insulating film 20. The capacitive contact plug 25 penetrates a first interlayer insulating film 12. Moreover, the first interlayer insulating film 12 is covered with a stopper film 37.

The plate electrode 32 is covered with a second interlayer insulating film 19, and a first contact plug 34 is provided in a through hole that penetrates the second interlayer insulating film 19, and moreover, an upper metal wiring 35 is formed on the upper surface of the second interlayer insulating film 19. The upper electrode 29 is connected to the upper metal wiring 35, with the embedded film 31, the plate electrode 32 and the first contact plug 34 interposed therebetween. Additionally, the upper metal wiring 35 and the second interlayer insulating film 19 are covered with a protective film 36.

Figure 2:
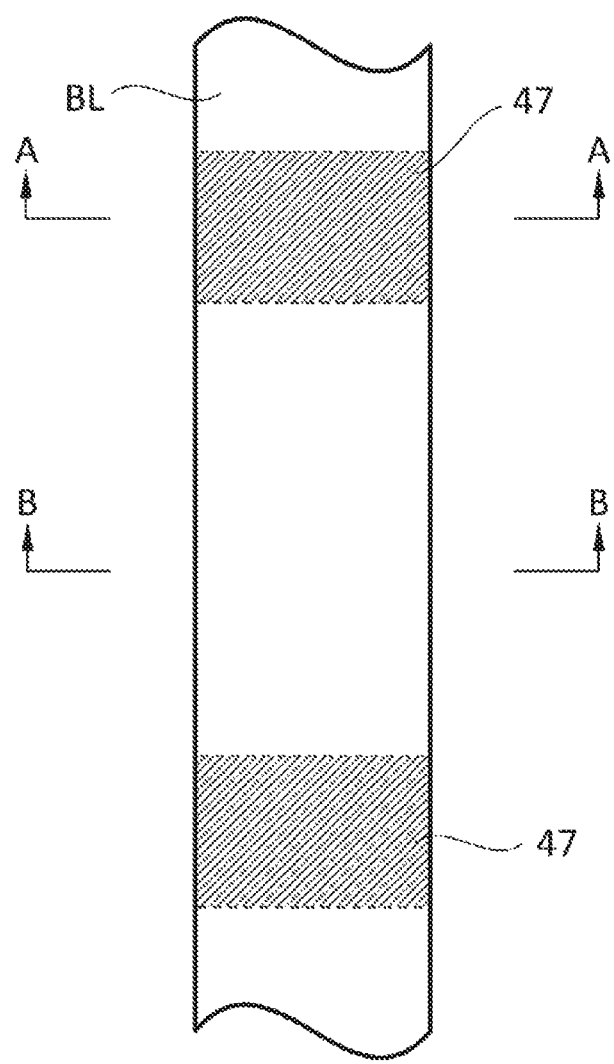
FIG. 2 is a schematic plan view showing a bit line BL.

FIG. 2 is a schematic plan view showing the bit line BL. As shown in FIG. 2, the bit line BL extends in the X-direction, and is connected to a plurality of bit contact plugs 47. One portion of its cross section shown in FIG. 1 indicates a cross section along line A-A of FIG. 2.

Figure 3:
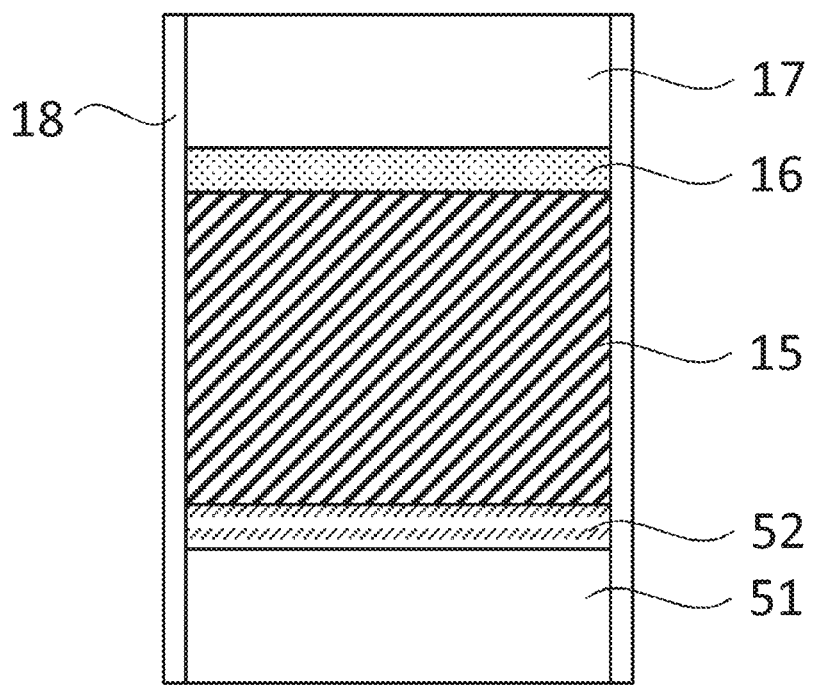
FIG. 3 is a substantial cross-sectional view showing the bit line BL along line B-B of FIG. 2.

FIG. 3 is a substantial cross-sectional view of the bit line BL along line B-B of FIG. 2. On the cross section shown in FIG. 3, a laminate of a silicon nitride film 51 and a barrier metal layer 52 is provided on a lower portion of the tungsten layer 15 constituting the bit line BL, and a laminate of a silicon oxynitride film 16 and a silicon nitride film 17 is provided on an upper portion of the tungsten layer 15. The barrier metal layer 52 may include titanium nitride or tungsten nitride, and its film thickness is, for example, from 2 nm to 10 nm.

The tungsten layer 15 and the silicon oxynitride film 16 are directly made in contact with each other, and neither tungsten nitride layer nor tungsten oxide layer or the like is interposed between the two layers. If the tungsten nitride layer is interposed between the two layers, the resistance value of the bit line BL will become higher because the film thickness of the tungsten layer 15 is made thinner by a portion of the film thickness of the tungsten nitride film. However, in the present embodiment, since no tungsten nitride layer or the like is interposed between the tungsten layer 15 and the silicon oxynitride film 16, the film thickness of the tungsten layer 15 is sufficiently ensured. Thus, it becomes possible to reduce the resistance value of the bit line BL.

The film thickness of the silicon oxynitride film 16 is preferably set to 2 nm or more to 10 nm or less. This is because, if the film thickness of the silicon oxynitride layer is less than 2 nm, oxygen that has invaded from the surface of the silicon oxynitride film 16 might reach the tungsten layer 15, thereby oxidizing the surface layer of the tungsten layer 15; in contrast, if the film thickness of the silicon oxynitride layer 16 exceeds 10 nm, cracks or the like might occur due to membrane stress. The reason that the membrane stress of the silicon oxynitride film 16 is high is because, as will be described later, the silicon oxynitride film 16 is formed by a PVD method. On the silicon oxynitride film 16, a silicon nitride film 17 formed by a CVD method or an ALD method is stacked. The film thickness of the silicon nitride film 17 is sufficiently thicker than the film thickness of the silicon oxynitride film 16.

Figure 4:
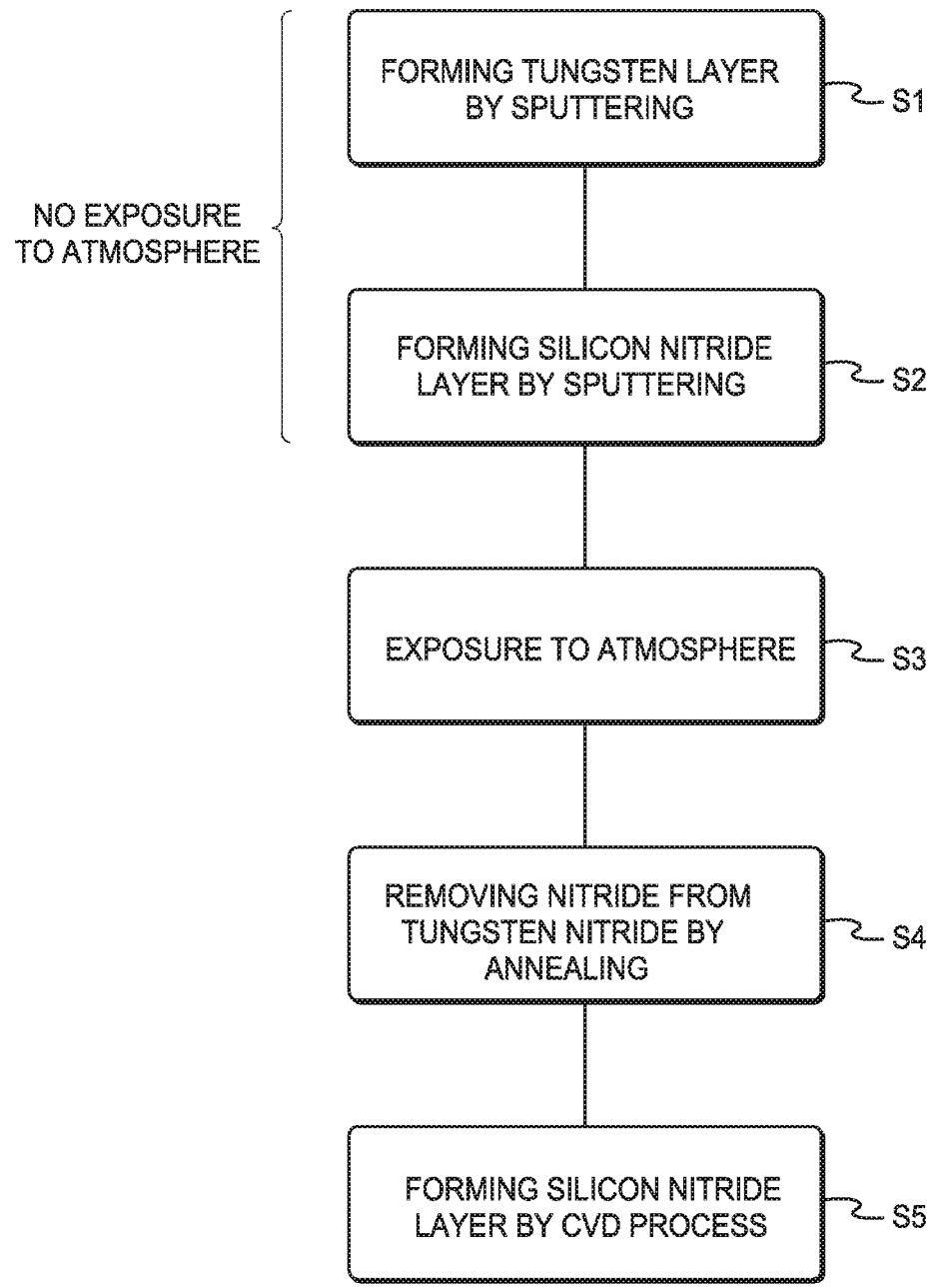
FIG. 4 is a flow chart for use in explaining one portion of a manufacturing process of the bit line BL.

FIG. 4 illustrates a flow chart for use in explaining one portion of a production process of the bit line BL. Moreover, FIG. 5 to FIG. 8 are substantial cross-sectional views showing the bit line BL in the respective processes. Additionally, cross sections shown in FIG. 5 to FIG. 8 illustrate states prior to patterning.

Figure 5:
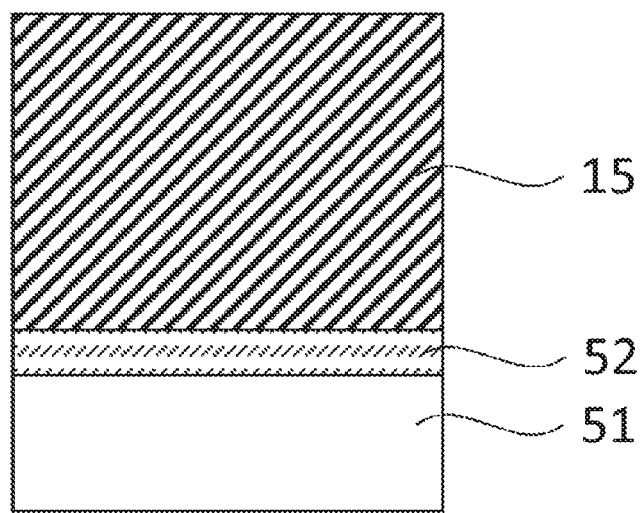
FIG. 5 is a substantial cross-sectional view showing the bit line BL in step S1.
Figure 6:
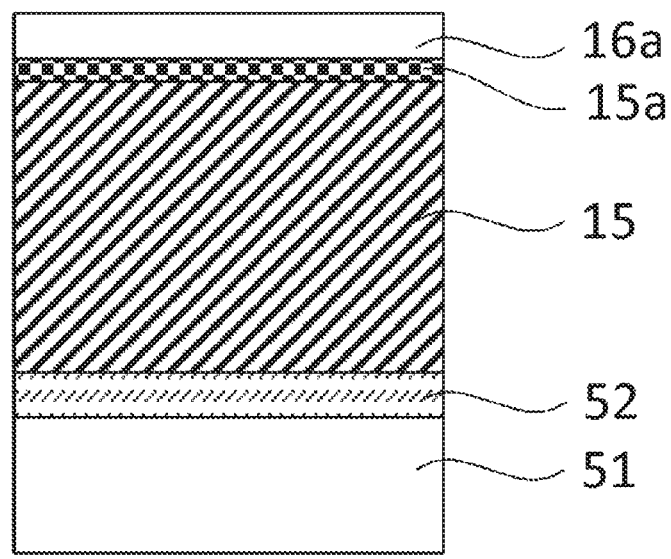
FIG. 6 is a substantial cross-sectional view showing the bit line BL in step S2.

First, as shown in FIG. 5, on a surface of a laminate including the silicon nitride film 51 and the barrier metal layer 52, a tungsten layer 15 is formed by a sputtering method (step S1). Next, as shown in FIG. 6, without the tungsten layer 15 being exposed to the atmosphere, that is, with it being kept at a highly vacuumed state, a silicon-rich silicon nitride film 16a is formed on the surface of the tungsten layer 15 (step S2). The silicon-rich silicon nitride film 16a refers to a film having a high molar ratio of Si in comparison with Si:N=3:4 that is a stoichiometric ratio of complete silicon nitride ($Si_3N_4$), and in particular, it is preferable to make a molar ratio of silicon (Si) higher than a molar ratio of nitrogen (N). Since such a silicon-rich silicon nitride film 16a lacks nitrogen in the film in comparison with complete silicon nitride ($Si_3N_4$), the resulting nature is such that by capturing external nitrogen, it tries to become more complete silicon nitride ($Si_3N_4$).

The silicon-rich silicon nitride film 16a can be formed by carrying out a sputtering process in a plasma atmosphere of argon and nitrogen by the use of a silicon target. The silicon nitride film 16a may be formed by the sputtering process preferably with a first stage in which a high frequency output is set to a first power and a second stage in which the high frequency output is set to a second power that is higher than the first power. Thus, an initial layer having a small film stress is formed in the first stage, and in the second stage, a highly dense film is formed. The film-forming amount in the first stage is preferably set to be smaller than the film-forming amount in the second stage. For example, in the first stage, by carrying out sputtering for about 2 seconds, with the power of the high frequency output being set to 500 W or less, a silicon nitride layer having a thickness of 1.5 to 1.8 nm is formed, and in the second stage, by carrying out sputtering, with the power of the high frequency output being set to 1000 to 4000 W or less, a silicon nitride layer having a thickness of 1.8 nm to 2.2 nm can be formed.

In this manner, in the present embodiment, in processes from the film formation of the tungsten film 15 to the film formation of the silicon nitride film 16a, no films are exposed to the atmosphere, the surface layer of the tungsten layer 15 is not oxidized to be formed into tungsten oxide. Therefore, no whisker is generated from the tungsten layer 15.

Figure 9:
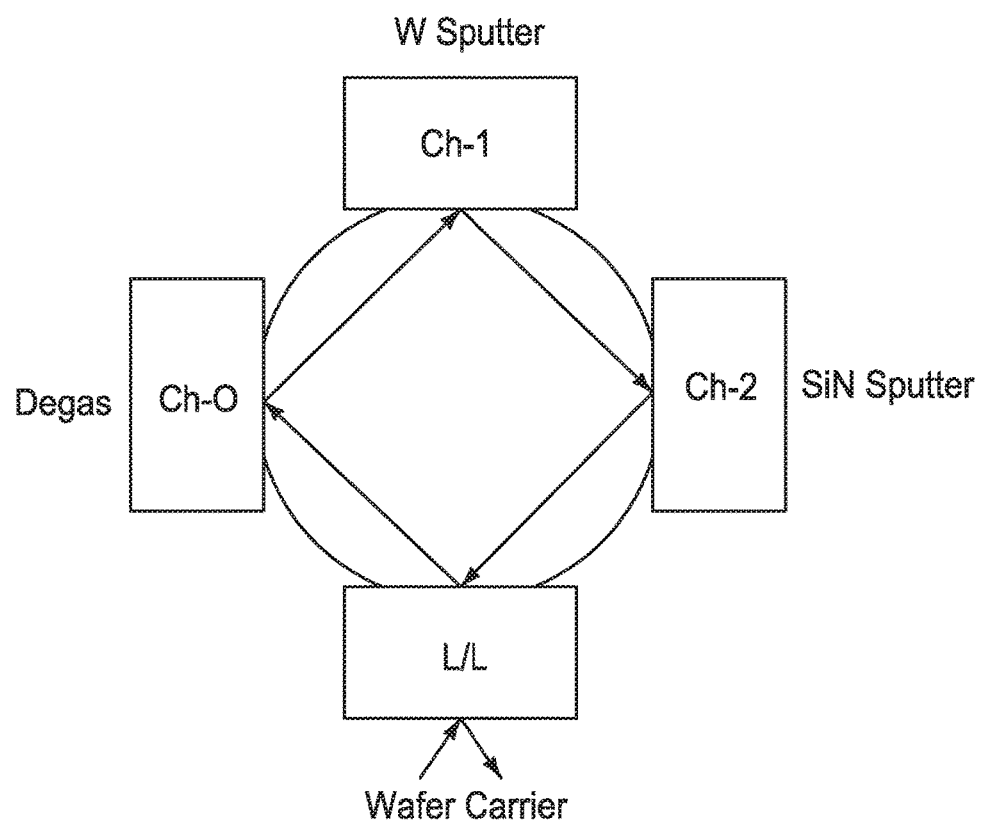
FIG. 9 is a schematic view for use in explaining a configuration of a sputtering device.

A continuous sputtering process without being exposed to the atmosphere can be realized by using, for example, a multi-chamber apparatus shown in FIG. 9. The apparatus shown in FIG. 9 includes a chamber ch-1 for forming a tungsten film, a chamber ch-2 for forming a silicon-rich silicon nitride film and chamber ch-0 for degassing, as well as a transporting mechanism for transporting a silicon wafer between chambers. First, a silicon wafer stored in a wafer carrier is transported to a chamber ch-0 through a load lock mechanism L/L, and after being evacuated to be an argon atmosphere, is further transported to the chamber ch-1. Then, after the tungsten layer 15 has been formed thereon in the chamber ch-1, it is further transported to the chamber ch-2, with its highly-vacuumed state being maintained, so that the silicon-rich silicon nitride film 16a is formed thereon. The silicon wafer on which film forming processes have been finished is recovered by a wafer carrier through the load lock mechanism L/L. By using the apparatus having these mechanisms, a series of processes from the film formation of the tungsten layer 15 to the film formation of the silicon nitride film 16a can be continuously carried out, without being exposed to the atmosphere.

When the silicon-rich silicon nitride film 16a is formed by the sputtering method, the tungsten layer 15 is nitrided by plasma of argon and nitrogen, with the result that as shown in FIG. 6, the surface layer of the tungsten layer 15 is changed into a tungsten nitride layer 15a having a high resistance value.

Figure 7:
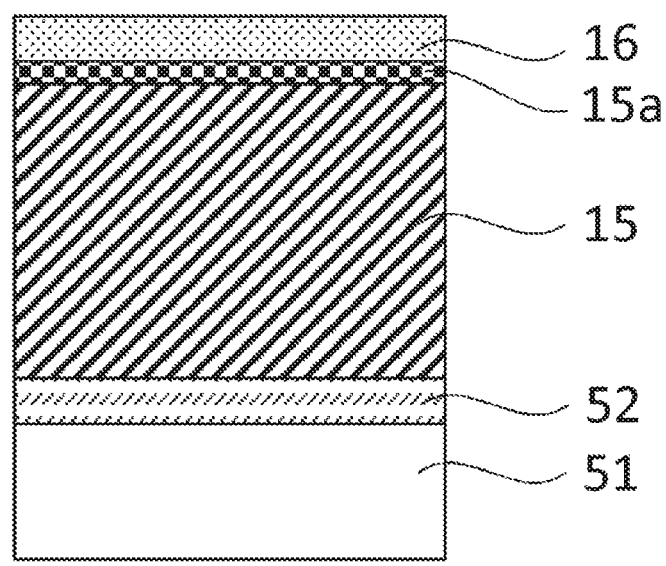
FIG. 7 is a substantial cross-sectional view showing the bit line BL in step S3.

In the case when, after completion of the film formation of the silicon-rich silicon nitride film 16a, the silicon wafer is exposed to the atmosphere (step S3), the silicon-rich silicon nitride film 16a is oxidized to be changed into a silicon oxynitride film 16, as shown in FIG. 7. However, since the oxidation depth is about 2 nm, when the film thickness of the silicon-rich silicon nitride film 16a is 2 nm or more, oxygen invaded therein by the exposure to the atmosphere is prevented from reaching the tungsten layer 15 so that the surface of the tungsten layer 15 is not oxidized.

Figure 8:
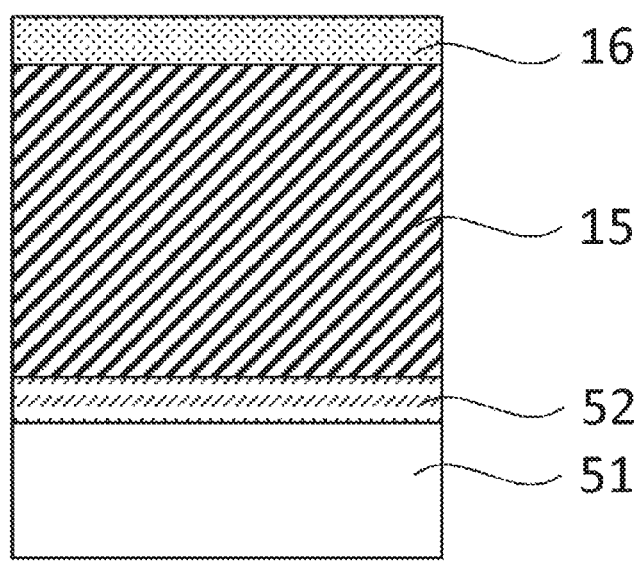
FIG. 8 is a substantial cross-sectional view showing the bit line BL in step S4.

Next, for preparation of a film forming process of the silicon nitride film 17, a silicon wafer is pre-heated to 600° C. or more (step S4). Thus, since the silicon oxynitride film 16 is activated, nitrogen is removed from the silicon nitride layer 15a formed on the surface layer of the tungsten layer 15, and the nitrogen is transferred to the silicon oxynitride film 16 side. This is because coupling energy of the silicon oxynitride film is stronger than the coupling energy of tungsten nitride, and when heated to 600° C. or more, nitrogen is easily transferred from the tungsten nitride 15a to the silicon oxynitride film 16. As a result, nitrogen is forcefully removed from the tungsten nitride layer 15a, and returned to the original tungsten layer 15 as shown in FIG. 8. Therefore, increase of the resistance value caused by the tungsten nitride layer 15a is prevented.

Moreover, a silicon nitride film 17 is formed on the surface of the silicon oxynitride film 16 by a CVD method or an ALD method (step S5). Then, after patterning the bit line BL by using a mask not shown, side wall insulating films 18 are formed on the side faces so that the bit line BL is completed as shown in FIG. 3.

In this manner, in the present embodiment, since the tungsten layer 15 and the silicon-rich silicon nitride film 16a are continuously formed without being exposed to the atmosphere, the surface of the tungsten layer 15 is prevented from being oxidized. Moreover, from the tungsten nitride layer 15a that is formed when the silicon-rich silicon nitride film 16a is formed, nitrogen is forcefully removed by a heating process to be carried out thereafter, thus, no tungsten nitride layer 15 remains on the surface of the tungsten layer 15. Thus, since a state where the surface of the tungsten layer 15 is neither oxidized nor nitrided can be obtained, it becomes possible to achieve low resistance of the bit line BL.

The above description has explained preferable embodiments of the present invention; however, they are exemplary only, and without limited by the above-mentioned embodiments, various modifications may be made therein within a scope without departing from the gist of the present invention, and it is needless to say that those modifications will remain within the scope of the present invention.

For example, in the above-mentioned embodiments, the silicon-rich silicon nitride film 16a is film-formed by a sputtering method; however, the present invention is not intended to be limited by this. Therefore, the film forming process may be carried out by using another PVD method such as a vapor deposition method or the like, or a CVD method may be used. Moreover, it is not essential to carry out a forcefully removing process of nitrogen from the tungsten layer 15a by a pre-heating process, and another method, such as RTP or the like, may be used separately.

Moreover, the above-mentioned embodiments have been explained by exemplifying a configuration in which the present invention is applied to the bit line BL of a DRAM; however, the scope of the application of the present embodiment is not intended to be limited by this.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a semiconductor device, comprising:
   forming a tungsten layer over a semiconductor substrate in a first chamber;
   transferring the substrate over which the tungsten layer is formed from the first chamber to a second chamber without exposing into an atmosphere including oxygen; and
   forming a silicon nitride layer on the tungsten layer in the second chamber.

2. The method of claim 1, wherein the silicon nitride layer is a silicon rich nitride layer.

3. The method of claim 2, wherein a tungsten nitride layer is provided between the silicon rich nitride layer and the tungsten layer when the tungsten layer is formed.

4. The method of claim 3, further comprising;
   after the silicon nitride layer is formed, exposing the silicon nitride layer into the atmosphere including oxygen, thereby being converted a portion of the silicon nitride layer into a silicon oxynitride layer; and
   heating the semiconductor substrate including the silicon nitride layer and the tungsten nitride layer such that nitride in the tungsten nitride layer is absorbed form the silicon nitride layer, thereby the silicon oxynitride layer being in contact with the tungsten layer without intervening the tungsten nitride layer.

5. The method of claim 4, wherein the silicon rich nitride layer is formed by sputtering method.

6. The method of claim 5, wherein the sputtering is performed by using a silicon target under atmosphere of argon and nitrogen.

7. The method of claim 6, wherein the sputtering is performed by setting a high frequency output at a first power and then setting the high frequency output at a second power higher than the first power.

8. The method of claim 5, further comprising:
   forming a second silicon nitride layer on the silicon oxynitride layer by using CVD or ALD method.

9. The method of claim 4, wherein the heating is performed by over 600 degrees centigrade.

* * * * *

UNITED STATES PATENT AND TRADEMARK OFFICE
CERTIFICATE OF CORRECTION

PATENT NO.         : 10,438,954 B2
APPLICATION NO.    : 16/134771
DATED              : October 8, 2019
INVENTOR(S)        : Kenichi Kusumoto and Yasutaka Iuchi Page 1 of 1

It is certified that error appears in the above-identified patent and that said Letters Patent is hereby corrected as shown below:

In the Claims

Column 6, Line 45 - Replace "absorbed form" with --absorbed from--

Signed and Sealed this
Thirty-first Day of December, 2019

Andrei Iancu
*Director of the United States Patent and Trademark Office*